US010840675B2

(12) United States Patent
Lou et al.

(10) Patent No.: US 10,840,675 B2
(45) Date of Patent: Nov. 17, 2020

(54) EMITTER ARRAY THAT INCLUDES INHOMOGENEOUS EMITTER DISTRIBUTION TO FLATTEN A BEAM PROFILE OF THE EMITTER ARRAY

(71) Applicant: Lumentum Operations LLC, Milpitas, CA (US)

(72) Inventors: Xiaohua Lou, Dublin, CA (US); Delai Zhou, Milpitas, CA (US); Hery Djie, San Jose, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/202,510

(22) Filed: Nov. 28, 2018

(65) Prior Publication Data
US 2019/0267778 A1   Aug. 29, 2019

Related U.S. Application Data

(60) Provisional application No. 62/634,631, filed on Feb. 23, 2018.

(51) Int. Cl.
H01S 5/42       (2006.01)
H01L 27/15      (2006.01)
H01S 5/065      (2006.01)
H01S 5/042      (2006.01)
H01S 5/343      (2006.01)
H01S 5/22       (2006.01)
H01S 5/187      (2006.01)
H01S 5/028      (2006.01)

(52) U.S. Cl.
CPC ............ *H01S 5/423* (2013.01); *H01L 27/156* (2013.01); *H01S 5/0282* (2013.01); *H01S 5/0425* (2013.01); *H01S 5/0651* (2013.01); *H01S 5/187* (2013.01); *H01S 5/2215* (2013.01); *H01S 5/343* (2013.01); *H01S 2301/176* (2013.01)

(58) Field of Classification Search
CPC ........ H01S 5/423; H01S 5/0282; H01S 5/187; H01S 5/2215; H01S 2301/176; H01S 5/343; H01S 5/0425; H01S 5/0651; H01L 27/156

See application file for complete search history.

(56) References Cited

U.S. PATENT DOCUMENTS

| 2004/0120376 A1* | 6/2004 | Kwak | H01S 5/18311 |
| | | | 372/46.013 |
| 2017/0331254 A1* | 11/2017 | Li | H01S 5/18361 |
| 2018/0090909 A1* | 3/2018 | Graham | H01S 5/18361 |

* cited by examiner

Primary Examiner — Xinning (Tom) Niu
(74) Attorney, Agent, or Firm — Harrity & Harrity, LLP

(57) ABSTRACT

A vertical cavity surface emitting laser (VCSEL) array may comprise a first subset of VCSELs of a plurality of VCSELs, and a second subset of VCSELs of the plurality of VCSELs. One or more first beams to be emitted by the first subset of VCSELs, when the VCSEL array is powered, and one or more second beams to be emitted by the second subset of VCSELs, when the VCSEL array is powered, may have different patterns of areas of energy intensity. The different patterns of areas of energy intensity may include respective areas of high energy intensity and respective areas of low energy intensity.

21 Claims, 7 Drawing Sheets

Emitter Array 102-1

Emitter Array 102-3

EMITTER ARRAY THAT INCLUDES INHOMOGENEOUS EMITTER DISTRIBUTION TO FLATTEN A BEAM PROFILE OF THE EMITTER ARRAY

RELATED APPLICATION

This application claims priority under 35 U.S.C. § 119 to U.S. Provisional Patent Application No. 62/634,631, filed on Feb. 23, 2018, the content of which is incorporated by reference herein in its entirety.

TECHNICAL FIELD

The present disclosure relates to an emitter array and, more particularly, to an emitter array that includes inhomogeneous emitter distribution to flatten a beam profile of the emitter array.

BACKGROUND

A vertical emitter, such as a vertical cavity surface emitting laser (VCSEL), is a laser in which a beam is emitted in a direction perpendicular to a surface of a substrate (e.g., vertically from a surface of a semiconductor wafer). Multiple vertical emitters may be arranged in an array with a common substrate.

SUMMARY

According to some possible implementations, a vertical cavity surface emitting laser (VCSEL) array may comprise a first subset of VCSELs of a plurality of VCSELs; and a second subset of VCSELs of the plurality of VCSELs, wherein one or more first beams to be emitted by the first subset of VCSELs, when the VCSEL array is powered, and one or more second beams to be emitted by the second subset of VCSELs, when the VCSEL array is powered, have different patterns of areas of energy intensity, wherein the different patterns of areas of energy intensity include respective areas of high energy intensity and respective areas of low energy intensity.

According to some possible implementations, a method of forming a vertical cavity surface emitting laser (VCSEL) array may comprise forming a first subset of VCSELs of a plurality of VCSELs on or within a substrate, wherein forming the first subset of VCSELs includes forming the first subset of VCSELs such that the first subset of VCSELs is configured to output a first pattern of areas of energy intensity; and forming, in association with forming the first subset of VCSELs, a second subset of VCSELs of the plurality of VCSELs on or within the substrate, wherein forming the second subset of VCSELs includes forming the second subset of VCSELs such that the second subset of VCSELs is configured to output a second pattern of areas of energy intensity that is different than the first pattern of areas of energy intensity.

According to some possible implementations, an emitter array may comprise a first subset of emitters of a plurality of emitters; and a second subset of emitters of the plurality of emitters, wherein one or more first beams to be emitted by the first subset of emitters, when the emitter array is powered, and one or more second beams to be emitted by the second subset of emitters, when the emitter array is powered, have different patterns of areas of energy intensity, wherein the different patterns of areas of energy intensity include respective areas of high energy intensity and respective areas of low energy intensity that overlap with each other at least partially in a far field of the emitter array.

According to some possible implementations, a method may include: emitting, by a vertical cavity surface emitting laser (VCSEL) array of an optical device, light on an optical path toward a diffractive optical element of the optical device, wherein the VCSEL array includes: a first subset of VCSELs of a plurality of VCSELs, and a second subset of VCSELs of the plurality of VCSELs, wherein one or more first beams to be emitted by the first subset of VCSELs, when the VCSEL array is powered, and one or more second beams to be emitted by the second subset of VCSELs, when the VCSEL array is powered, have different patterns of areas of energy intensity, wherein the different patterns of areas of energy intensity include respective areas of high energy intensity and respective areas of low energy intensity; and transmitting, by the diffractive optical element, the light on the optical path.

According to some possible implementations, a method may include: emitting, by an emitter array, light to be used in association with generating a dot pattern, wherein the emitter array comprises a first subset of emitters of a plurality of emitters, and a second subset of emitters of the plurality of emitters, wherein one or more first beams to be emitted by the first subset of emitters, when the emitter array is powered, and one or more second beams to be emitted by the second subset of emitters, when the emitter array is powered, have different patterns of areas of energy intensity, wherein the different patterns of areas of energy intensity include respective areas of high energy intensity and respective areas of low energy intensity that overlap with each other at least partially in a far field of the emitter array; and generating, by a dot pattern generator, the dot pattern, wherein the dot pattern is generated by a diffractive optical element included in the dot pattern generator.

DETAILED DESCRIPTION

Figure 1A:
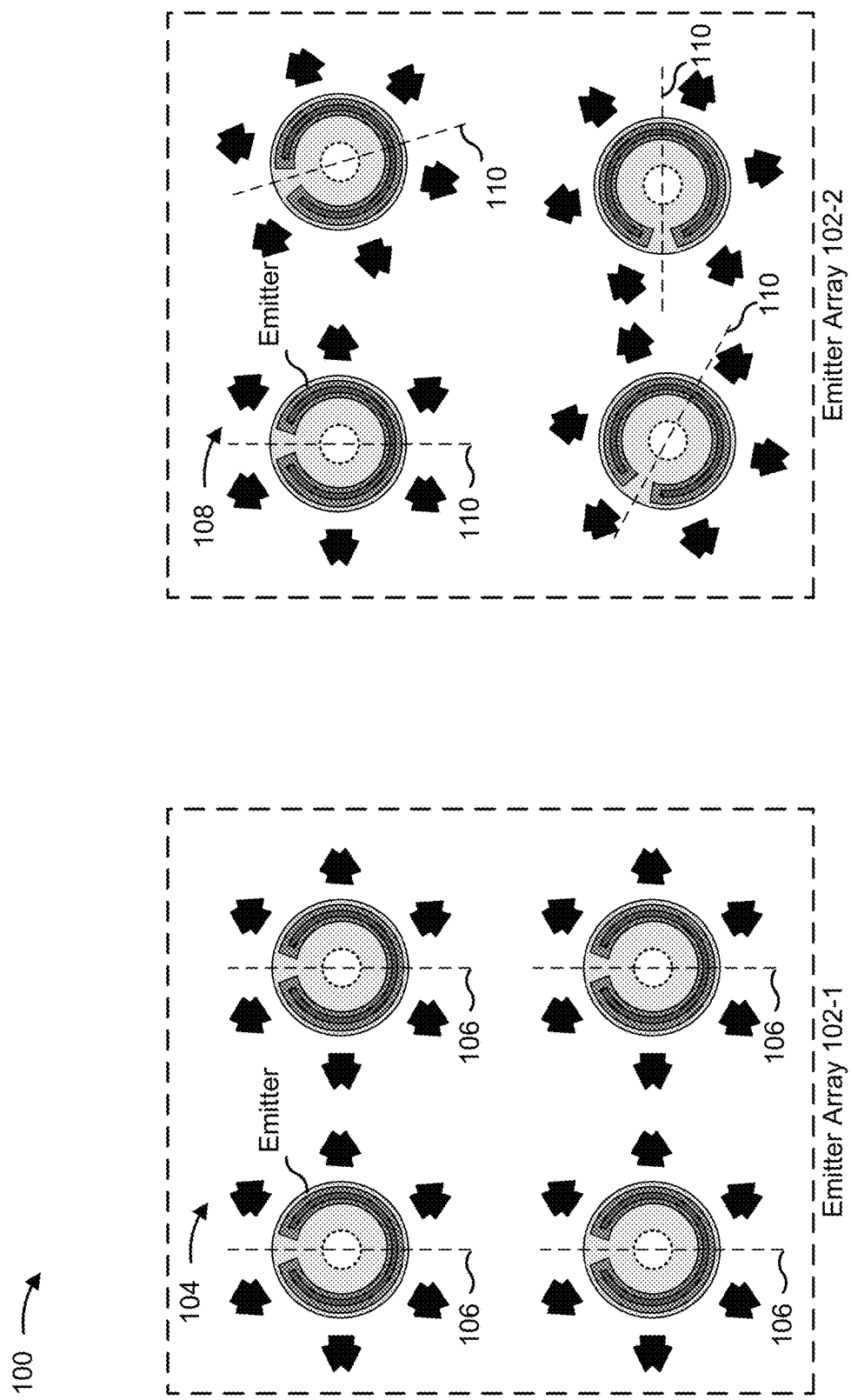
FIGS. 1A-1E are diagrams of an example implementation described herein.

The following detailed description of example implementations refers to the accompanying drawings. The same reference numbers in different drawings may identify the same or similar elements.

High power emitter arrays have become important to success in three dimensional (3D) sensing applications, including facial and gesture recognition in the gaming market and in the smartphone market. With the very small spectra width of an emitter and the precise tunability of emitter peak wavelength, significant improvement in 3D sensing quality and robustness can be achieved in both structured light (e.g., flood illuminators) and time-of-flight (TOF) active 3D sensing schemes, such as by applying a narrow bandpass wavelength filter in front of an infrared (IR) receiver. Furthermore, emitter arrays have been used as an all-around illumination source to enhance a 3D sensing user experience, independent of ambient light conditions.

Current emitter arrays are composed of many identical emitters with determined coordinates (such as a square grid, a radial grid, a hexagonal grid, a random grid, and a variable spacing grid) to deliver various benefits. Although the output power and efficiency of emitters is optimized with determined coordinates, the emitter beam profile beyond Rayleigh distance does not change much at fixed output power, after the shape of the emitter and optical confinement are defined. At a distance far beyond Rayleigh distance, the emitter array beam profile is treated as a simple arithmetic sum of individual emitters combined incoherently. As a result, significant non-uniformity of far field beam profiles is observed for a conventional homogeneous emitter array (e.g., where all emitters of an emitter array are configured in a similar manner in terms of aperture diameter, trench location, and/or the like and therefore have the same near field and far field characteristics) due to the same non-uniformity being present for beam profiles of beams from emitters of the emitter array.

In other words, having a homogeneous emitter array causes the emitter array to have a non-uniform beam profile, with areas of high energy intensity (e.g., hot spots) and areas of low energy intensity (e.g., dark spots), that matches a non-uniformity of beams emitted from emitters of the emitter array. This non-uniformity decreases an accuracy of a device that includes the homogeneous emitter array in a 3D sensing context, can cause eye-safety issues (e.g., due to the non-uniform beam far field profile of the emitter array), and/or the like.

Some implementations described herein provide an emitter array with inhomogeneous emitters to provide a flat array beam profile when powered (i.e., having an electrical current passing through the VCSEL array). For example, the emitter array may have non-overlapped hot spots of energy intensity and non-overlapped dark spots of energy intensity based on emitters of the emitter array being inhomogeneous. In this way, non-uniformity of a respective beam profile of emitters of the emitter array may cause the emitter array to have a flat beam profile where a difference in energy intensity between hot spots of energy intensity and dark spots of energy intensity may be reduced or eliminated. Such implementations facilitate better three-dimensional (3D) sensing imaging quality relative to a homogeneous emitter array. In addition, such implementations may facilitate better eye safety compliance relative to a homogeneous emitter array.

FIGS. 1A-1E are diagrams 100 of various comparisons between an example homogeneous emitter array and example inhomogeneous emitter arrays. As shown in FIG. 1A, diagram 100 includes an emitter array 102-1 (e.g., a homogeneous emitter array) and an emitter array 102-2 (e.g., an inhomogeneous emitter array). For illustrative purposes, only portions of emitter arrays 102-1 and 102-2 are shown. In addition, emitter array 102-1 and emitter array 102-2 may not be shown to scale with respect to each other. FIGS. 1A-1E depict various implementations related to reducing differences between areas of high energy intensity and areas of low energy intensity (e.g., to reduce or eliminate hot spots of energy intensity and/or dark spots of energy intensity) in an optical beam from an emitter array and compare the various implementations to a homogeneous emitter array.

In some implementations, an area of high energy intensity may correspond to an area of an emitter that outputs optical output at approximately a highest amount of energy intensity relative to other areas of the emitter (or an area of an optical beam from an emitter array that has approximately the highest energy intensity). In some implementations, an area of low energy intensity may correspond to an area of an emitter that outputs optical output at approximately a lowest amount of energy intensity relative to other areas of the emitter (or an area of an optical beam from an emitter that has approximately the lowest energy intensity). In some implementations, and as described elsewhere herein, a difference in energy intensity between an area of high energy intensity and an area of low energy intensity and/or a ratio of the high energy intensity and the low energy intensity may cause performance issues for an emitter array, may cause eye safety issues, and/or the like. Implementations described herein may be described in the context of an individual emitter and/or of an optical beam from the individual emitter and/or an emitter array that includes the individual emitter based on an optical beam from an emitter array ordinarily having the same configuration of areas of energy intensity as the individual emitters of the emitter array. In some implementations, a beam profile may be based on one or more additional factors such as surface relief, surface grating, and/or the like.

FIG. 1A shows a comparison between a homogeneous emitter array 102-1 and an inhomogeneous emitter array 102-2. Emitter array 102-2 may include an implementation related to reducing differences between areas of high energy intensity and areas of low energy intensity in an optical beam of an emitter array (e.g., an aggregated beam that is an aggregation of individual beams of individual emitters of the emitter array and that has an aggregated beam profile of beam profiles of individual emitters of the emitter array). As shown by reference number 104, emitter array 102-1 may include various emitters (see FIGS. 2A-2B for a more detailed description of emitter components). For example, four emitters are shown with respect to emitter array 102-1. In some implementations, an emitter may include a light-emitting diode (LED), a vertical cavity surface emitting laser (VCSEL), a vertical external cavity surface emitting laser (VECSEL), a laser, a light-emitting device, and/or the like. In some implementations, the various emitters of emitter array 102-1 may be homogeneous emitters. For example, the various emitters may have similar configurations of areas of energy intensity (e.g., due to having similar configurations of oxidation trenches), may be oriented in a similar manner (e.g., oriented in a similar manner about a respective aperture of the various emitters), may be similarly sized (e.g., may have a similar diameter for a respective mesa structure of the various emitters), may have a similar shape (e.g., are all circular emitters, as shown), may have a mode (e.g., a multimode or a single mode), and/or the like. As a specific example, and as shown by reference numbers 106, the various emitters of emitter array 102-1 may be oriented in a similar manner (e.g., oriented in a similar manner about a respective aperture of the various emitters). As further shown with respect to the various emitters of emitter array 102-1, the various emitters may be similarly sized, may be a same shape, and/or the like. As a result, an optical beam from the various emitters of emitter array 102-1 may have a similar configuration of areas of energy intensity.

As a result of the depicted configuration, an optical beam from emitter array 102-1 may have areas of high energy intensity relative to other areas based on the similar configuration and orientation of the various emitters. In some implementations, the difference in energy intensity between the areas of high energy intensity and the areas of low energy intensity of emitter array 102-1 may cause emitter array 102-1 to have an energy intensity ratio (e.g., a ratio of the highest energy intensity to the lowest energy intensity) that satisfies a threshold, as described in more detail elsewhere herein. This can negatively impact a performance of emitter array 102-1 in a 3D sensing context, cause eye safety issues, and/or the like.

As shown by reference number 108, emitter array 102-2 may include various emitters. Similarly to emitter array 102-1, emitters of emitter array 102-2 may have a similar size, a similar shape, and/or the like. However, and as shown by reference numbers 110, emitters of emitter array 102-2 may have different orientations across emitter array 102-2, rather than being similarly oriented (as was the case with emitter array 102-1). For example, components of the various emitters may be rotated about a respective aperture of the various emitters by various amounts of degrees. Continuing with the previous example, the various emitters may be rotated by five degrees, 10 degrees, 30 degrees, and/or the like from each other (or from a particular emitter), such that the orientation of the various emitters are offset from each other. For example, an orientation of an emitter may be offset by five degrees, 10 degrees, 30 degrees, and/or the like from an orientation of an adjacent emitter. In some implementations, an orientation may include an angular orientation of oxidation trenches associated with an emitter of an emitter array.

Although FIG. 1A shows emitters of emitter array 102-2 as having different orientations from all other emitters of emitter array 102-2, in some implementations, the orientation may be in a pattern. For example, every other emitter may have a particular orientation, every row or column of emitters may have a particular orientation, and/or the like rather than the emitters having different orientations from all other emitters of emitter array 102-2.

In some implementations, and based on the orientation of the emitters with respect to each other, the emitters of emitter array 102-2 may have different orientations of areas of energy intensity. For example, the areas of energy intensity may be offset from each other by the same amount as an offset in orientations of the emitters. Continuing with the previous example, if emitters of emitter array 102-2 are oriented based on a 10 degree offset from each other, then respective areas of energy intensity may be offset across the emitters of emitter array 102-2 by the same amount. In some implementations, and as described in more detail with regard to FIG. 1B, this offset of areas of energy intensity may reduce a difference between areas of high energy intensity and areas of low energy intensity for an optical beam from emitter array 102-2. This improves a use of emitter array 102-2 in 3D sensing contexts by facilitating a more uniform beam (e.g., a beam with more uniform areas of energy intensity), reduces or eliminates eye safety issues that may otherwise be caused by having a similar configuration across emitters of emitter array 102, and/or the like.

In some implementations, and depending on a quantity of emitters included in emitter array 102-2 and offset orientations of emitters included in emitter 102-2, the offset orientation may result in a continuous ring of output spots, where areas of high energy intensity and areas of low energy intensity are fully overlapped across emitter array 102-2.

In some implementations, emitter array 102-2 may include various subsets of differently configured emitters (e.g., where respective orientations of the emitters vary across different subsets, where different subsets include different configurations of areas of high energy intensity and/or areas of low energy intensity, and/or the like). For example, emitter array 102-2 may include two subsets of emitters, three subsets of emitters, four subsets of emitters, etc. In some implementations, emitter array 102-2 may include multiple subsets of emitters so that emitter array 102-2 has a desired far-field uniformity. For example, in a case where emitter array 102-2 includes six emitters, the six emitters may need to be grouped into at least two subsets of emitters. Continuing with the previous example, a first subset of emitters may have a nominal (or reference) orientation and a second subset of emitters may have an offset orientation from the first subset of emitters (e.g., a 30 degree offset orientation). This causes the second set of emitters to output light between areas of high energy intensity of the first set of emitters, thereby causing areas of high energy intensity of the second subset of emitters to overlap with areas of low energy intensity of the first subset of emitters.

Alternatively, emitter array 102-2 may include three subsets of emitters, where a first subset of emitters has a nominal orientation, a second subset of emitters has a 20 degree offset orientation, and a third set of emitters has a 40 degree offset orientation. This causes the second and third subsets of emitters to emit light between areas of high energy intensity of the first subset of emitters, thereby resulting in a more uniform beam profile from emitter array 102-2 in terms of areas of energy intensity than if the first, second, and third sets of emitters had a same orientation. Alternatively, emitter array 102-2 may include four subsets of emitters, with a first subset of emitters having a nominal orientation, a second subset of emitters having a 15 degree offset orientation from the nominal orientation, a third subset of emitters having a 30 degree offset orientation, and a fourth subset of emitters having a 45 degree offset orientation. Emitter array 102-2 may include additional quantities of subsets of emitters with similar configurations of offset orientations from a nominal orientation.

In some implementations, when emitter array 102-2 includes multiple subsets of emitters, different subsets of emitters may include a same quantity of emitters. This facilitates a uniform distribution of light from emitter array 102-2. In some implementations, different subsets of emitters may include different quantities of emitters. In this case, sets of emitters from each subset of emitters may be oriented in the manner described elsewhere herein to overlap areas of high energy intensity with areas of low energy intensity within a subset of emitters.

Figure 1B:
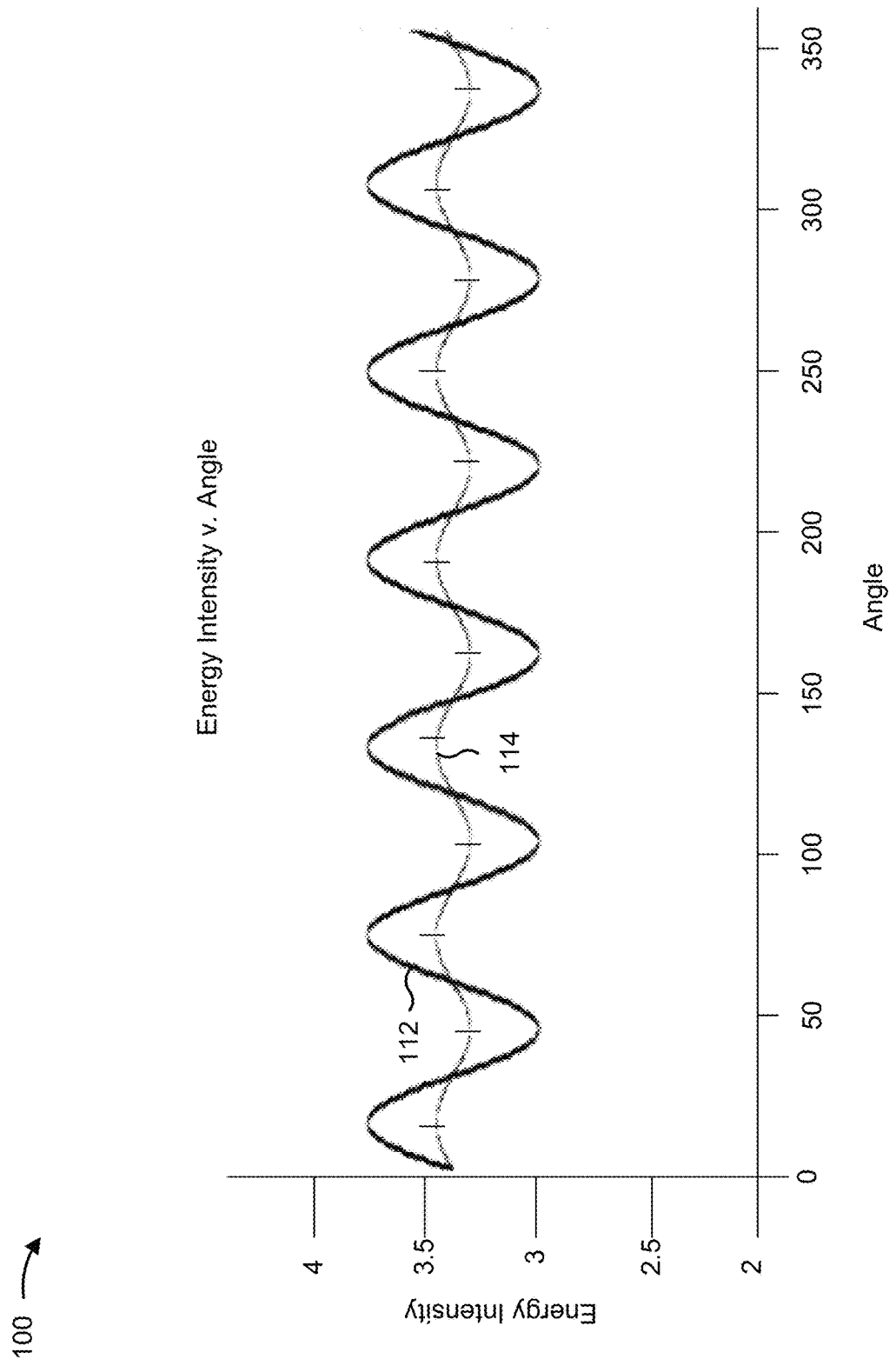

FIG. 1B shows example energy intensity profiles (e.g., energy intensity versus angle about an aperture) of emitter array 102-1 (or of an optical beam from emitter array 102-1) and of emitter array 102-2 (or of an optical beam from emitter array 102-2). For example, FIG. 1B shows a plot of energy intensity of a respective optical beam emitted from emitter array 102-1 and emitter array 102-2 at different points around a center of the respective optical beam. The data illustrated in FIG. 1B was gathered at a constant radius from a center of the respective optical beam. Curve 112 shows an energy intensity profile of emitter array 102-1. As shown by curve 112, the energy intensity profile includes areas of high energy intensity (e.g., hot spots of energy intensity with a maximum intensity of approximately 3.6) and areas of low energy intensity (e.g., dark spots of energy intensity with a minimum intensity of approximately 3.0). This results in an energy intensity difference of 0.6 (arbitrary units) between the areas of high intensity and the areas of low intensity of emitter array 102-1 and an energy intensity ratio of approximately 1.2. In some cases, the energy intensity difference and/or the energy intensity ratio may satisfy a threshold, such that an optical beam from emitter array 102-1 cannot be used in particular contexts (e.g., a 3D sensing context), such that the optical beam fails to satisfy eye-safety thresholds, and/or the like.

Curve 114 shows an energy intensity profile of emitter array 102-2. As shown by curve 114, the energy intensity profile of emitter array 102-2 (e.g., of an optical beam emitted from emitter array 102-2) may include areas of high energy intensity (e.g., hot spots with a maximum intensity of approximately 3.4) and areas of low energy intensity (e.g., dark spots with a minimum intensity of approximately 3.3). This results in an energy intensity difference (arbitrary units) of approximately 0.1 and an energy intensity ratio of approximately 1.03 for an optical beam from emitter array 102-2. In some implementations, and in contrast to that described with regard to emitter array 102-1, the energy intensity difference and/or the energy intensity ratio for emitter array 102-2 may satisfy a threshold such that hot spots and/or dark spots of energy intensity within the optical beam from emitter array 102-2 are reduced or eliminated. For example, and as shown in FIG. 1B, curve 114 for emitter array 102-2 has a reduced difference between high and low values relative to curve 112. This results in a more uniform energy intensity profile for the optical beam from emitter array 102-2, which may facilitate improved results when emitter array 102-2 is used in particular contexts, such as a 3D sensing context, and/or may reduce or eliminate eye-safety issues that may otherwise occur when an optical beam includes hot spots of energy intensity due to having a threshold energy intensity difference between areas of high energy intensity and areas of low energy intensity.

As described above, varying a respective orientation of emitters across an emitter array can reduce or eliminate a difference between areas of high energy intensity and areas of low energy intensity of an optical beam emitted from the emitter array. The values shown in and described with regard to FIG. 1B are used merely for explanatory and/or illustrative purposes. In practice, the values of energy intensity, an energy intensity difference, an energy intensity ratio, and/or the like may be different than what is shown in and described with regard to FIG. 1B.

Figure 1C:
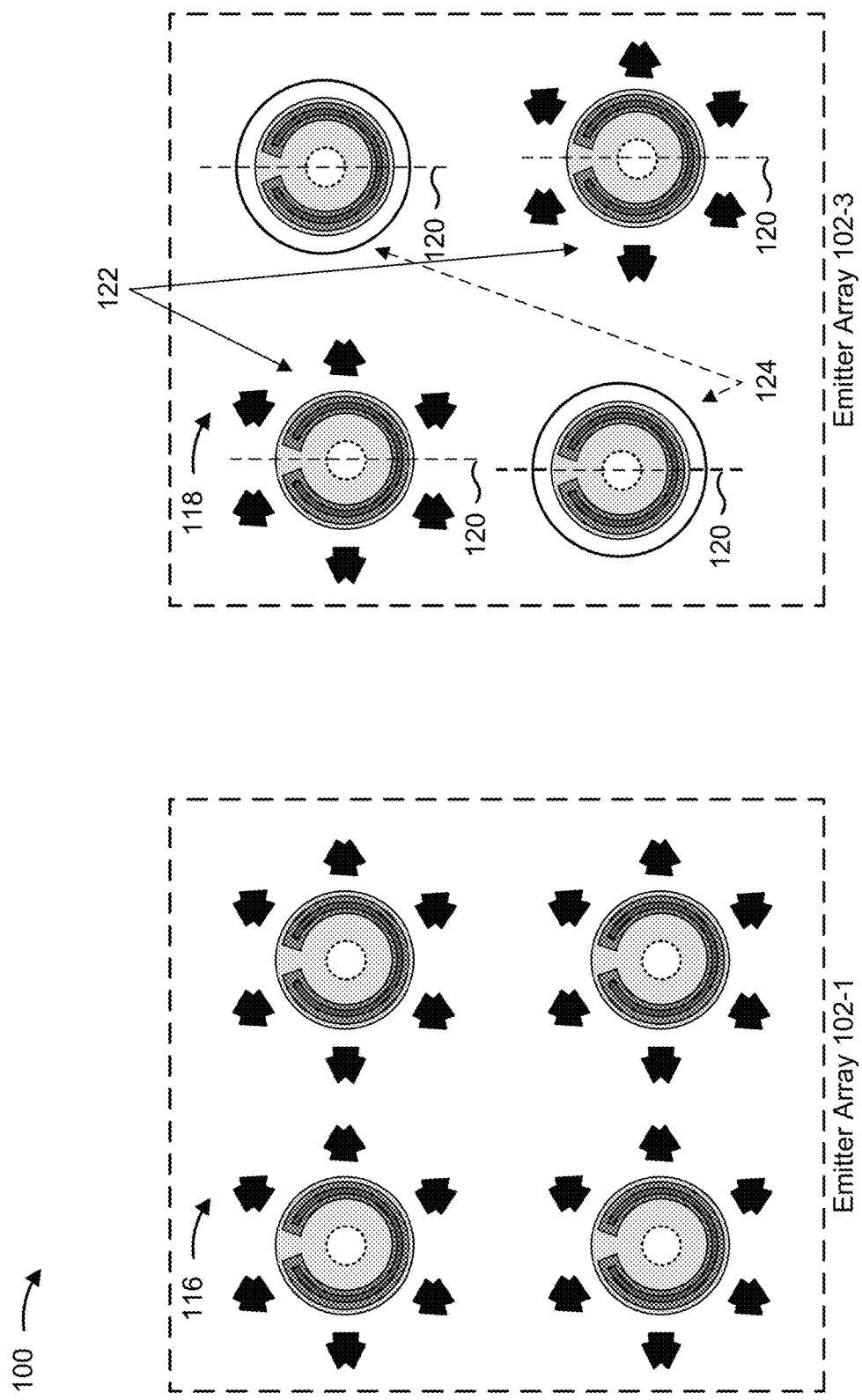

FIG. 1C shows another comparison of a homogeneous emitter array and an inhomogeneous emitter array that includes an implementation related to reducing or eliminating an energy intensity difference between areas of high energy intensity and areas of low energy intensity of an optical beam of an emitter array. Emitter array 102-1 shown in FIG. 1C is the same as or similar to that described with regard to FIGS. 1A and 1B (e.g., may be a homogeneous emitter array). For example, and as shown by reference number 116, emitter array 102-1 may include various emitters that are similarly configured and/or similarly oriented within emitter array 102-1.

As further shown, FIG. 1C shows emitter array 102-3. As shown by reference number 118, emitter array 102-3 may include various emitters (e.g., emitters 200 described elsewhere herein). In some implementations, the various emitters of emitter array 102-3 may be similarly configured and/or oriented. For example, the various emitters of emitter array 102-3 may have a similar configuration of areas of high energy intensity and areas of low energy intensity due to having a similar shape, a similar configuration of oxidation trenches, and/or the like. Additionally, or alternatively, and as another example, the various emitters of emitter array 102-3 may be similarly oriented. For example, and as shown by reference numbers 120, the various emitters of emitter array 102-3 may have a same orientation about a respective aperture of the various emitters.

As shown by reference number 122, emitter array 102-3 may include a first set of emitters with a first mode (e.g., a multimode). Although FIG. 1C shows this first set of emitters as being at least partly non-adjacent to each other (e.g., interleaved with a second set of emitters described below), the first set of emitters may be adjacent to each other and formed in a row, may be formed in a column (or another shape with one or more other emitters that have a same mode, such as a hexagon, a square, a triangle, and/or the like), and/or the like.

As shown by reference number 124, emitter array 102-3 may include a second set of emitters with a second mode (e.g., a single mode). Although FIG. 1C shows this second set of emitters as being at least partly non-adjacent to each other (e.g., interleaved with a first set of emitters described above), the second set of emitters may be adjacent to each other and formed in a row, may be formed in a column (or another shape with one or more other emitters that have a same mode, such as a hexagon, a square, a triangle, and/or the like), and/or the like.

In some implementations, and as described below, the first set of emitters and the second set of emitters may have different beam profiles based on having different modes. For example, emitters of the first set of emitters may have a ring of alternating areas of high energy intensity and areas of low energy intensity around centers of the emitters, while emitters of the second set of emitters may have an area of high energy intensity at centers of the emitters and an area of low energy intensity around the centers of the emitters. These differing configurations of areas of high energy intensity and low energy intensity may cause areas of high energy intensity associated with the centers of the emitters of the second set of emitters to overlap areas of low energy intensity associated with centers of emitters of the first set of emitters. In some implementations, emitters of the first set of emitters may have offset orientations in the manner described elsewhere herein to cause areas of low energy intensity of some emitters of the first set of emitters and areas of high energy intensity of other emitters of the first set of emitters to overlap across the first set of emitters (e.g., based on different patterns and/or orientations of areas of high energy intensity and areas of low energy intensity). In this way, emitter array 102-3 may include a subset of single mode emitters and a subset of multimode emitters. In some implementations, emitter array 102-3 may include various subsets of single mode and/or multimode emitters. For example, emitter array 102-3 may include a subset of single mode emitters, a subset of emitters with a four order mode, and a subset of emitters with a six order mode, where emitters of the various subsets have different orientations across and/or within the various subsets of emitters. In some implementations, overlap of beams and/or areas of energy intensity described herein may occur in a far field of an emitter array (e.g., at a distance from an emission surface of the emitter array that is beyond Rayleigh distance).

This may cause an optical beam from emitter array 102-3 to have a lower energy intensity ratio relative to emitter array 102-1, as described in more detail below, and/or may cause the optical beam from emitter array 102-3 to have a lower energy intensity ratio relative to the optical beam from the first set of emitters and the optical beam from the second set of emitters. In some implementations, and as described below, emitter array 102-3 may have a more uniform energy intensity profile relative to emitter array 102-1 based on the lower energy intensity profile.

Figure 1D:
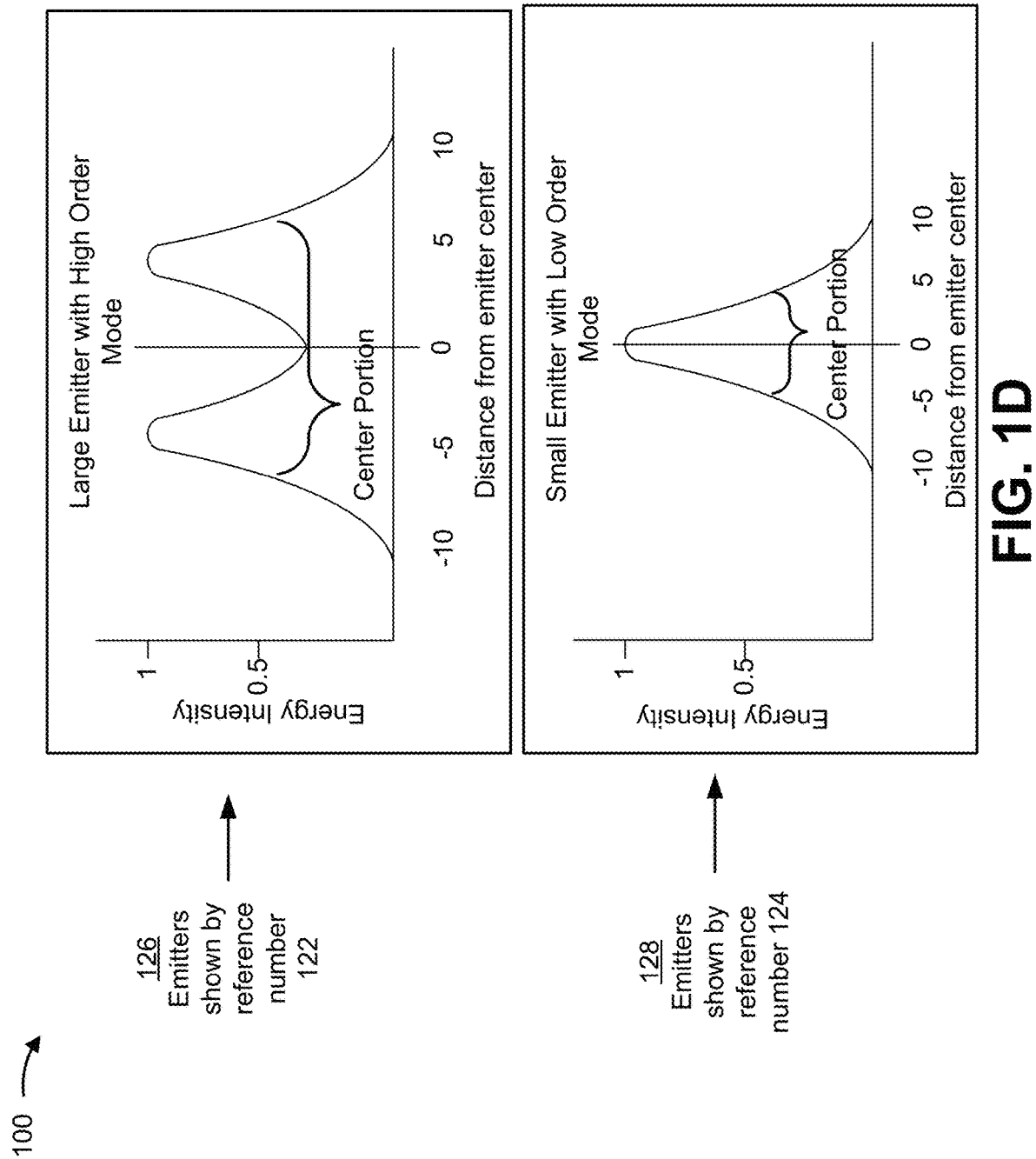

FIG. 1D shows example respective plots of energy intensity profiles across emitters of the first set of emitters and the second set of emitters described with regard to FIG. 1C. For example, FIG. 1D shows respective plots of energy intensity versus distance from an emitter center along a diameter or chord (e.g., where the emitter center line is represented by "0" on the respective plots) for the first set of emitters and the second set of emitters. Although described in the context of individual emitters, the concepts shown and described with regard to the plots apply to an optical beam from an entire set of emitters (e.g., the first set of emitters or the second set of emitters).

Plot 126 shows an energy intensity profile of the first set of emitters (emitters shown with respect to reference number 122). For example, and as shown by the plot 126, the energy intensity profile of the first set of emitters may have a lower relative intensity toward a center of an emitter (or toward a center of an optical beam emitted from the first set of emitters), and a higher relative energy intensity toward a respective edge of the emitter (or toward an edge of the optical beam emitted from the first set of emitters). This may result in corresponding areas of high energy intensity and low energy intensity in the optical beam from the first set of emitters.

In some implementations, an energy intensity difference and/or an energy intensity ratio between the areas of the high energy intensity and the areas of the low energy intensity shown with respect to a center portion of plot 126 may satisfy a threshold. For example, the energy intensity difference shown with respect to the center portion of plot 126 may be approximately 0.6 (e.g., approximately one minus approximately 0.4) and the energy intensity ratio may be approximately 2.5 (e.g., approximately one divided by approximately 0.4), and these values may satisfy a threshold that would cause the first set of emitters to be unusable for particular contexts, and/or to be a danger for eye safety.

In some implementations, plot 126 may show a high order mode (or multimode) output of the first subset of emitters. In some implementations, the high order mode output (e.g., quantity of output spots) may be a result of one or more factors. For example, the high order mode output may be a result of a weakly confined lasing diameter (e.g., 10-11 microns versus eight to nine microns for a low order mode (or single mode) output), a quantity and/or configuration of oxidation trenches that are formed around a center of an emitter, and/or the like.

Plot 128 shows an energy intensity profile of the second set of emitters (emitters shown with respect to reference number 124). For example, and as shown by the plot 128, the energy intensity profile of the second set of emitters may have a lower relative energy intensity toward an edge of an emitter (or toward an edge of an optical beam emitted by the second set of emitters), and a higher relative energy intensity toward a center of the emitter (toward a center of the optical beam emitted from the second set of emitters). This may result in corresponding areas of high energy intensity and areas of low energy intensity in an optical beam being emitted from the second set of emitters. In some implementations, plot 128 may show a low order mode (or single mode) output of the second subset of emitters.

In some implementations, an energy intensity difference and/or an energy intensity ratio between the areas of high energy intensity and the areas of low energy intensity shown with respect to a center portion of plot 128 may satisfy a threshold. For example, the energy intensity difference shown with respect to the center portion of plot 128 may be approximately 0.6 (e.g., approximately one minus approximately 0.4) and the energy intensity ratio may be approximately 2.5 (e.g., approximately one divided by approximately 0.4), and these values may satisfy a threshold that would cause the second set of emitters to be unusable for particular contexts, and/or to be a danger for eye safety.

In some implementations, if emitter array 102-3 included just the first set of emitters or just the second set of emitters, then an optical beam from emitter array 102-3 may have the respective hot spots of energy intensity described with regard to the first set of emitters and the second set of emitters (e.g., similar to emitter array 102-1). However, and as described below, the combination of the first set of emitters and the second set of emitters in emitter array 102-3 may cause an optical beam from emitter array 102-3 to have a more uniform energy intensity profile, thereby reducing or eliminating the respective hot spots that would otherwise occur if only the first set of emitters or only the second set of emitters was included in emitter array 102-3.

Figure 1E:
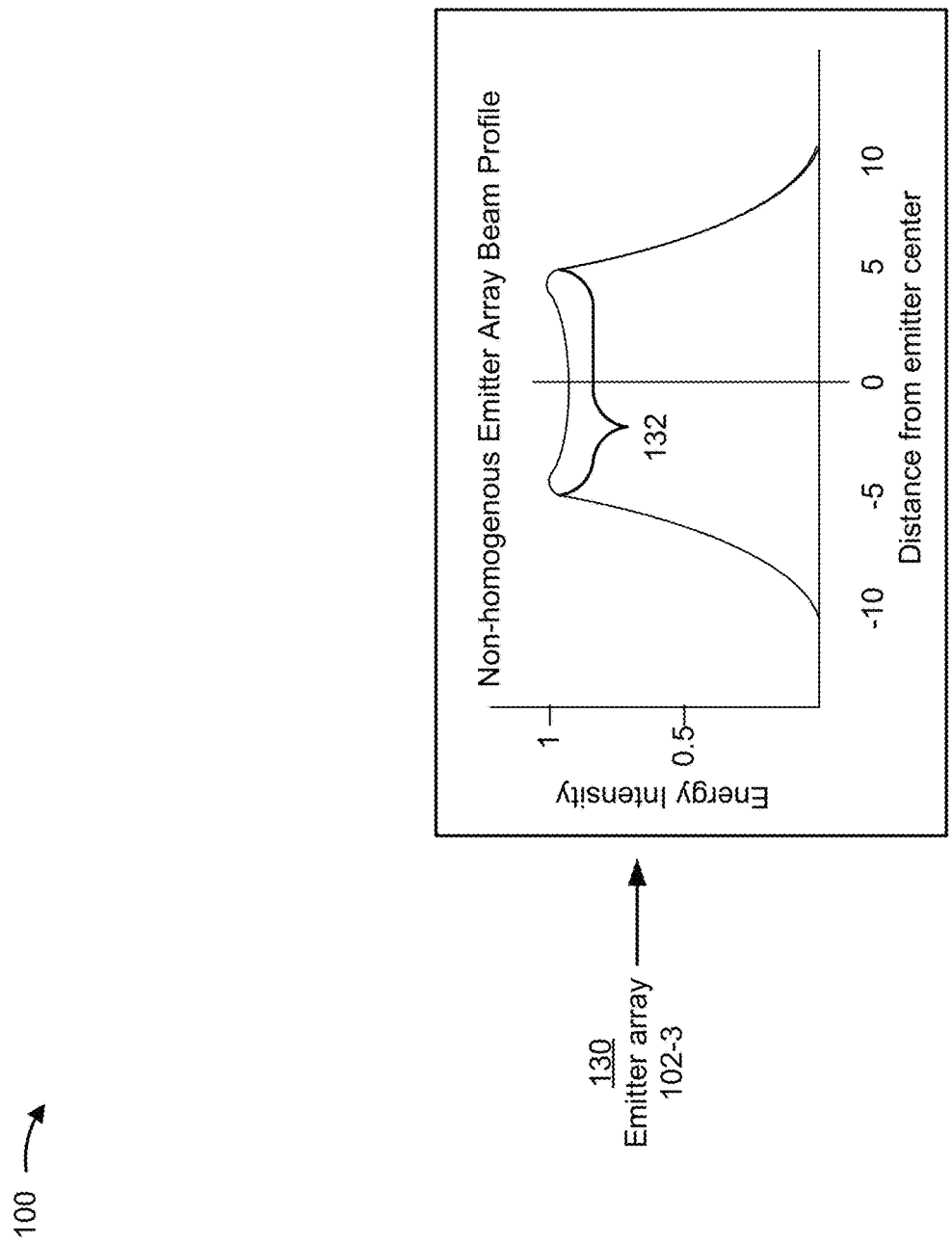

FIG. 1E shows an example plot of energy intensity across emitter array 102-3 based on including the first set of emitters and the second set of emitters configured in the manner described herein. For example, and as shown by reference number 130, an optical beam of emitter array 102-3 may have an energy intensity profile that is more uniform relative to the respective beam profile of either the first set of emitters or the second set of emitters alone. As shown by reference number 132, a center portion of the optical beam from emitter array 102-3 has a more uniform energy intensity profile relative to a respective center portion of a respective optical beam for the first set of emitters and the second set of emitters. For example, and as described above, the difference in energy intensity for the respective center portions of the first set of emitters and the second set of emitters is approximately 0.6 and 0.6, respectively, and the difference in energy intensity for the center portion of the optical beam of emitter array 102-3 is less than approximately 0.1 (e.g., approximately one minus approximately 0.9). Consequently, hot spots and/or dark spots of energy intensity that would otherwise occur as a result of having a threshold difference in energy intensity across a center portion of an optical beam are reduced or eliminated, thereby resulting in an optical beam with a more uniform energy intensity profile.

In this way, emitters of emitter arrays 102-2 and 102-3 may be varied (e.g., via variation in configuration, size, mode, orientation, and/or the like) to reduce or eliminate hot spots and/or dark spots of energy intensity in an optical beam from emitter arrays 102-2 and 102-3, thereby resulting in an optical beam with a more uniform energy intensity profile relative to a homogeneous emitter array. This reduces or eliminates performance and/or usage issues that would otherwise result from having hot spots and/or dark spots of energy intensity in an energy intensity profile of an optical beam. In addition, this reduces or eliminates eye-safety issues that would otherwise be present when using an optical beam that includes hot spots and/or dark spots of energy intensity. Further, this facilitates use of emitter arrays 102-2 and 102-3 with higher relative optical output power in situations when a lower relative optical output power would need to be used due to a presence of hot spots and/or dark spots of energy intensity in an optical output beam from emitter arrays 102-2 and 102-3.

As indicated above, the implementations depicted in and described with respect to FIGS. 1A-1E are provided merely as examples. Other example implementations are possible and may differ from what was described with respect to FIGS. 1A-1E. Although FIGS. 1A-1E are described with respect to varying orientation and mode across an emitter array, other implementations are possible. For example, one or more shapes of emitters of an emitter array may be varied across the emitter array (e.g., a combination of differently shaped emitters, such as a combination of circular emitters (like those shown in FIGS. 1A-1E) and rectangular emitters, and/or the like may be used), coordinates for emitters may be varied across an emitter array (e.g., some emitters of an emitter array may be organized into a pattern of rows and columns and other emitters may be organized in a radial pattern, or another shape), a configuration of oxidation trenches, mesas, implants, and/or the like for current confinement may be varied across an emitter array to vary a pattern of hot spots and dark spots associated with an optical beam from the emitter array (e.g., a combination of circular trenches and hexagonal trenches, or trenches in another shape, may be used across an emitter array), and/or the like. Although FIGS. 1A-1E show emitters that include particular configurations of oxidation trenches, the implementations apply equally to emitters with different quantities of oxidation trenches than shown in FIGS. 1A-1E. For example, emitters described herein may include two oxidation trenches, three oxidation trenches, four oxidation trenches, etc. As such, the implementations described herein apply to emitters with any quantity of areas of high energy intensity and/or low energy intensity, such as emitters with a single area of high energy intensity and/or low energy intensity, with two areas of high energy intensity and/or low energy intensity, with three areas of high energy intensity and/or low energy intensity, etc.

In some implementations, emitter array 102 described herein may produce an array of structured light (e.g., for three-dimensional sensing). For example, emitter array 102 may be included in an optical device, a structured light system, and/or the like and may emit light (or a beam) on an optical path. Additionally, or alternatively, and as another example, emitter array 102 described herein may emit light in a dot pattern or may be used in association with generating a dot pattern (e.g., the dot pattern may be generated by a dot pattern generator that includes a diffractive optical element).

Although some implementations have been described in the context of two sets of emitters, the implementations apply equally to any quantity of sets of emitters, such as three sets of emitters, four sets of emitters, and/or the like.

Figure 2A:
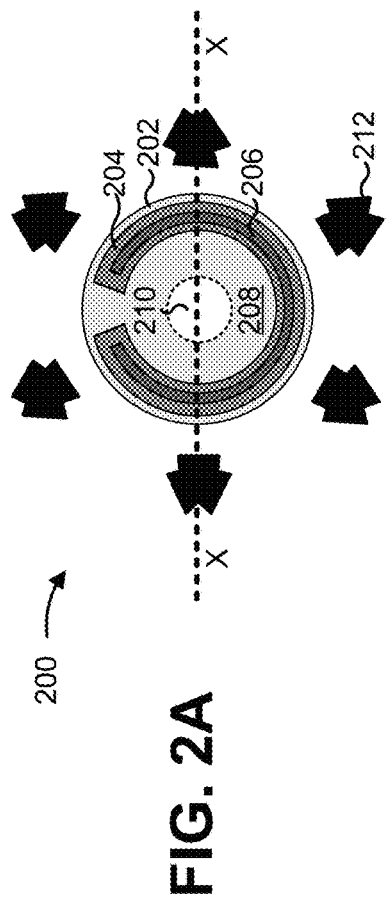
FIGS. 2A and 2B are diagrams depicting a top-view of an example vertical-emitting device and a cross-sectional view of the example vertical-emitting device, respectively.
Figure 2B:
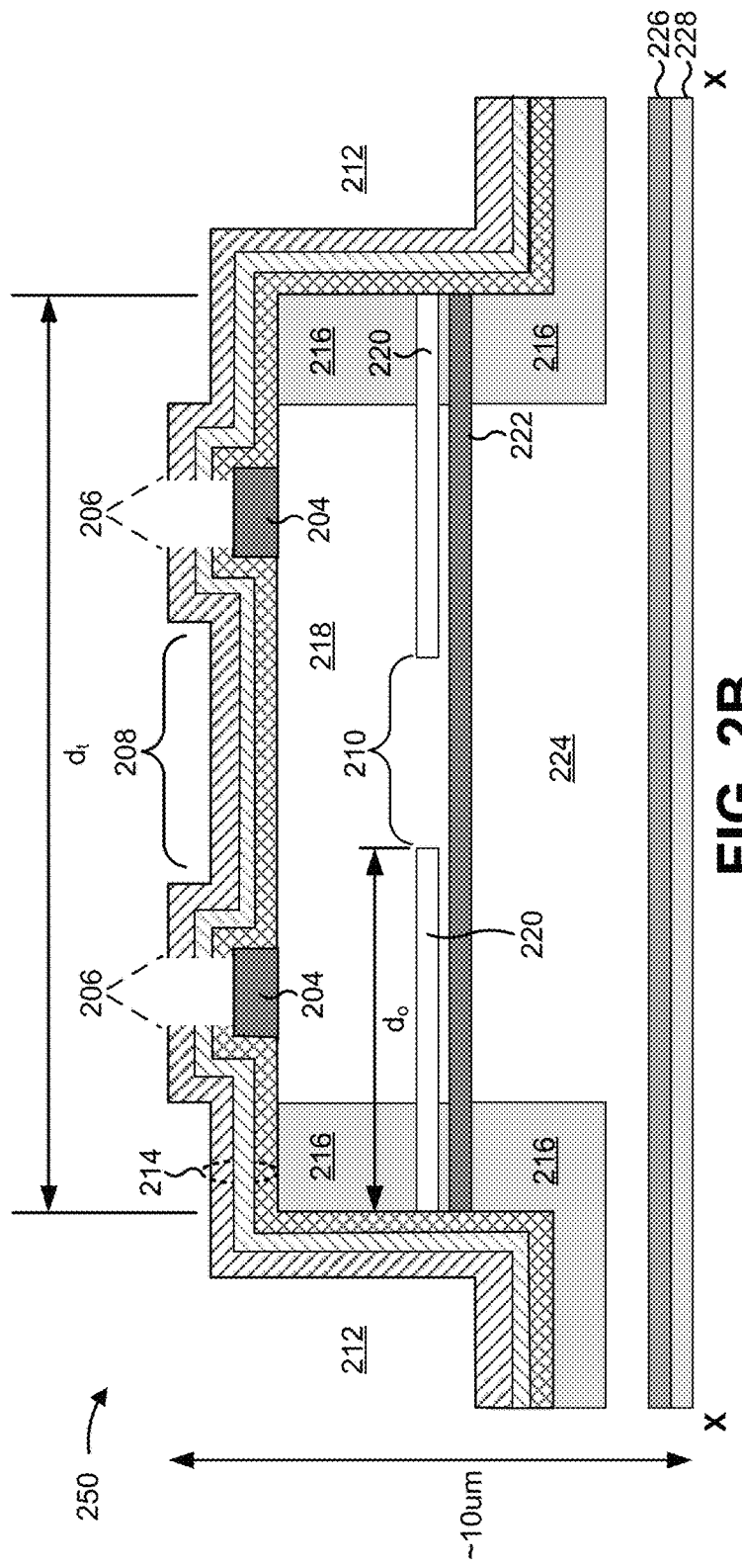

FIGS. 2A and 2B are diagrams depicting a top-view of an example emitter 200 and a cross-sectional view 250 of example emitter 200, respectively. As shown in FIG. 2A, emitter 200 may include a set of emitter layers constructed in an emitter architecture. In some implementations, emitter 200 may correspond to one or more vertical-emitting devices described herein.

As shown in FIG. 2A, emitter 200 may include an implant protection layer 202 that is circular in shape in this example. In some implementations, implant protection layer 202 may have another shape, such as an elliptical shape, a polygonal shape, or the like. Implant protection layer 202 may be defined based on a space between sections of implant material included in emitter 200 (not shown). As shown by the medium gray area in FIG. 2A, emitter 200 may include a P-Ohmic metal layer 204 that may be constructed in a partial ring-shape (e.g., with an inner radius and an outer radius). As shown, P-Ohmic metal layer 204 may be positioned concentrically over implant protection layer 202 (i.e., the outer radius of P-Ohmic metal layer 204 may be less than or equal to the radius of implant protection layer 202). Such a configuration may be used, for example, in the case of a P-up/top-emitting emitter 200. In the case of a bottom-emitting emitter 200, the configuration may be adjusted as needed.

As further shown in FIG. 2A, emitter 200 may include a dielectric via opening 206 that is formed (e.g., etched) on a dielectric passivation/mirror layer that may cover P-Ohmic metal layer 204 (not shown). As shown, dielectric via opening 206 may be formed in a partial ring-shape (e.g., similar to P-Ohmic metal layer 204) and may be formed concentrically over P-Ohmic metal layer 204 such that metallization of the dielectric passivation/mirror layer contacts P-Ohmic metal layer 204. In some implementations, dielectric via opening 206 and/or P-Ohmic metal layer 204 may be formed in another shape, such as a full ring-shape or a split ring-shape.

As further shown, emitter 200 may include an optical aperture 208 in a portion of the emitter within the inner radius of the partial ring-shape of P-Ohmic metal layer 204. Emitter 200 may emit a laser beam via optical aperture 208. As further shown, emitter 200 may also include a current confinement aperture 210 (e.g., an oxide aperture formed by an oxidation layer of emitter 200 (not shown)). Current confinement aperture 210 may be formed below optical aperture 208.

As further shown in FIG. 2A, emitter 200 may include a set of oxidation trenches 212 that may be spaced (e.g., equally, unequally) around a circumference of implant protection layer 202. How close oxidation trenches 212 can be positioned relative to the optical aperture 208 is typically dependent on the application, and may be limited by implant protection layer 202, P-Ohmic metal layer 204, dielectric via opening 206, and/or manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 may include a set of six oxidation trenches 212, in practice, other designs may be used, such as a compact emitter that includes five oxidation trenches 212, seven oxidation trenches 212, and/or the like. As another example, while emitter 200 is a circular emitter design, in practice, other designs may be used, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

While the design of emitter 200 is described as potentially including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not limited to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and/or a P-Ohmic metal layer 204. As shown, emitter 200 may, for example, have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR), or another suitable type of reflector.

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_o$ in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, and/or the like.

Top mirror 218 may include a top reflector layer of emitter 200. For example, top mirror 218 may include a DBR or another suitable type of reflector.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, and/or differently arranged layers than those shown in FIG. 2B. Additionally, or alternatively, a set of layers (e.g., one or more layers) of emitter 200 may perform one or more functions described as being performed by another set of layers of emitter 200.

Figure 3:
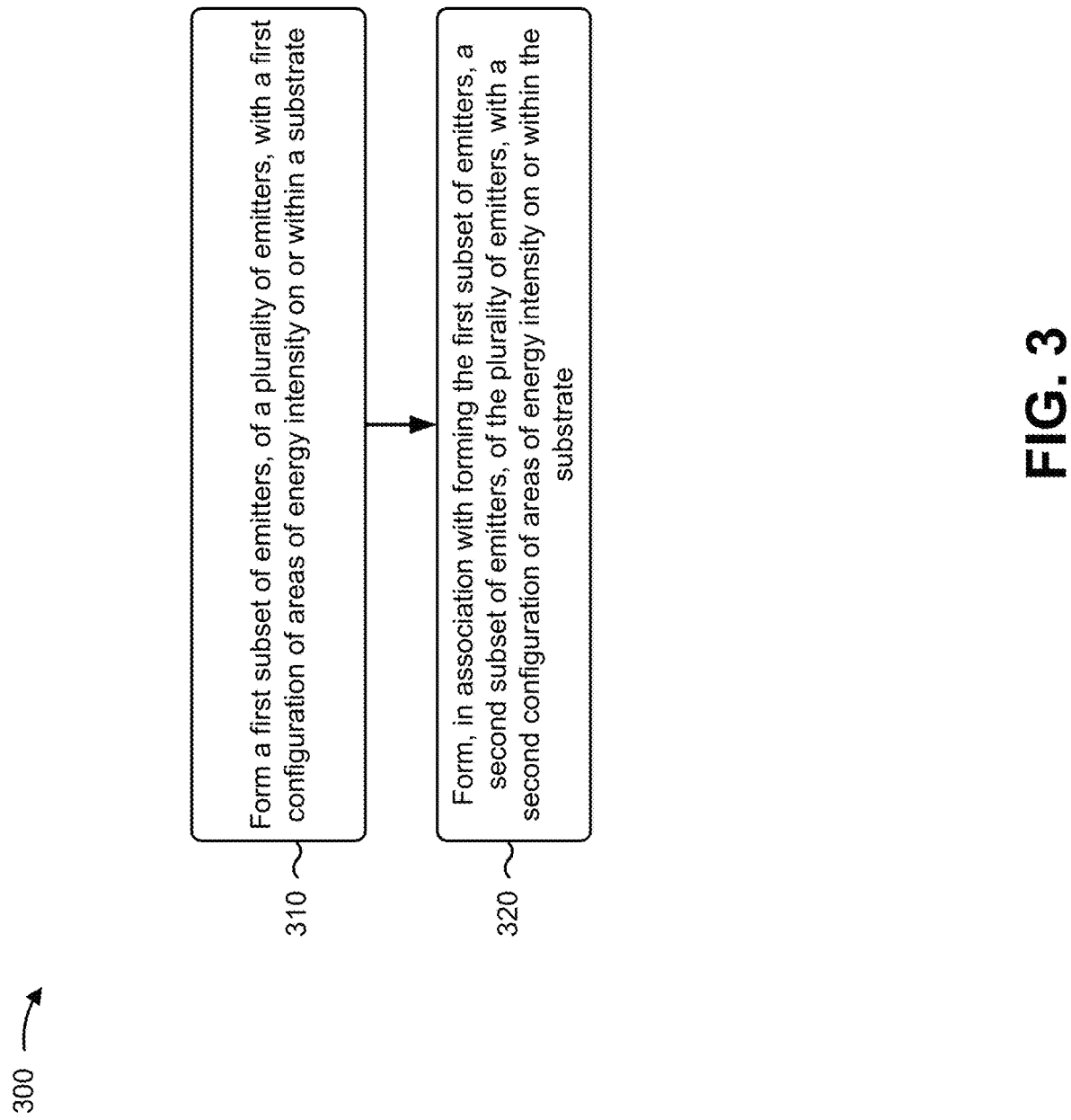
FIG. 3 is a flow chart of an example process for producing an emitter array that includes inhomogeneous emitter distribution to flatten a beam profile of the emitter array.

FIG. 3 is a flow chart of an example process 300 for producing an emitter array that includes inhomogeneous emitter distribution to flatten a beam profile of the emitter array. For example, FIG. 3 shows an example process 300 for producing an emitter array that includes an inhomogeneous emitter 200 distribution to flatten a beam profile of the emitter array, similar to that described elsewhere herein.

As shown in FIG. 3, process 300 may include forming a first subset of emitters, of a plurality of emitters, with a first configuration of areas of energy intensity on or within a substrate (block 310). For example, process 300 may include forming (e.g., building or arranging) a first subset of emitters 200, of a plurality of emitters 200, with a first configuration of areas of energy intensity on or within a substrate (e.g., substrate layer 226), in a manner that is the same as or similar to that described elsewhere herein.

In some implementations, process 300 may include forming the first subset of emitters 200 such that the first subset of emitters 200 is configured to output a first configuration of areas of energy intensity. For example, process 300 may include forming the first subset of emitters 200 with a first orientation of emitters 200 corresponding to a distribution of areas of energy intensity, a first mode of emitters 200 corresponding to a distribution of areas of energy intensity (e.g., based on a first diameter of a respective mesa structure of the first subset of emitters 200, a first trench-to-trench diameter of the respective mesa structure, and/or the like), a first shape of emitters 200 corresponding to a distribution of areas of energy intensity (e.g., based on the first subset of emitters 200 having a first shape, based on the first subset of emitters 200 being associated with oxidation trenches of a first shape), a first layout and/or pattern of oxidation of emitters 200 corresponding to a distribution of areas of energy intensity, and/or the like.

In some implementations, to form the plurality of emitters 200, various epitaxial layers may be formed on or within the substrate layer. For example, the substrate layer may include a gallium arsenide (GaAs) or Indium Phosphide (InP) substrate. In some implementations, trenches may be etched into layers of the plurality of emitters 200 (e.g., using a wet etching technique or a dry etching technique). For example, a set of oxidation trenches (e.g., oxidation trenches 212) may be etched into the layers of the plurality of emitters 200. In some implementations, the plurality of emitters 200 may be formed in a pattern. For example, the plurality of emitters 200 may be formed in a uniform pattern, such as a matrix pattern, a lattice pattern, and/or the like.

As further shown in FIG. 3, process 300 may include forming, in association with forming the first subset of emitters, a second subset of emitters, of the plurality of emitters, with a second configuration of areas of energy intensity on or within the substrate (block 320). For example, process 300 may include forming, in association with forming the first subset of emitters 200, a second subset of emitters 200, of the plurality of emitters 200, with a second configuration of areas of energy intensity on or within the substrate, in a manner that is the same as or similar to that described elsewhere herein. Continuing with the previous example, the first subset of emitters 200 and the second subset of emitters 200 may be formed using the same sequence of epitaxy and etch steps, and differences between the first subset of emitters 200 and the second subset of emitters 200 may be formed using different patterns across a single mask set (e.g., that includes different masks for different layers emitters 200) associated with the first subset of emitters 200 and the second subset of emitters 200. In some implementations, forming the second subset of emitters 200 may include forming the second subset of emitters 200 in a manner that is the same as or similar to that described with regard to the first subset of emitters 200.

In some implementations, process 300 may include forming the second subset of emitters 200 such that the second subset of emitters 200 is configured to output a second configuration of areas of energy intensity that is different than the first configuration of areas of energy intensity. For example, process 300 may include forming the second subset of emitters 200 such that the second subset of emitters 200 has a second orientation of emitters 200 corresponding to a distribution of areas of energy intensity different than the first orientation, a second mode of emitters 200 corresponding to a distribution of areas of energy intensity that is different than the first mode, a second shape of emitters 200 corresponding to areas of energy intensity that is different than the first shape, a second layout and/or pattern of oxidation of emitters 200 corresponding to a distribution of areas of energy intensity that is different that the first layout and/or pattern, and/or the like.

Process 300 may include additional implementations, such as any single implementation or any combination of implementations described below and/or in connection with one or more other processes described elsewhere herein.

In some implementations, process 300 may include forming the first subset of emitters 200 and the second subset of emitters 200 with various orientations of oxidation trenches (e.g., oxidation trenches 212) for the first subset of emitters 200 and the second subset of emitters 200. For example, the first subset of emitters 200 and the second subset of emitters 200 may have different orientations of oxidation trenches, similar to that described elsewhere herein. In some implementations, the different configurations of areas of energy intensity may comprise the various orientations of oxidation trenches.

In some implementations, process 300 may include forming the second subset of emitters 200 such that respective areas of high energy intensity and respective areas of low energy intensity of the first configuration and the second configuration overlap with each other during emission. For example, during emission of a first beam from the first subset of emitters 200 and a second beam from the second subset of emitters 200, at least one area of high energy intensity of the first beam may overlap at least partially with at least one area of low energy intensity of the second beam. In some implementations, the overlap during emission may generate an energy intensity ratio for a beam emitted from an emitter array (e.g., emitter array 102) that is less than a first energy intensity ratio of a first beam emitted by the first subset of emitters 200 and a second energy intensity ratio of a second beam emitted by the second subset of emitters 200. For example, during emission and based on the first configuration associated with the first subset of emitters 200 and the second configuration associated with the second subset of emitters 200, the beam emitted from the emitter array may have a lower energy intensity ratio than an energy intensity ratio of a beam emitted from the first subset of emitters 200 or a beam emitted from the second subset of emitters 200.

In some implementations, process 300 may include forming the first subset of emitters 200 with a first diameter of a respective mesa structure of the first subset of emitters 200, and forming the second subset of emitters 200 with a second diameter of the respective mesa structure of the second subset of emitters 200 in association with forming the first subset of emitters 200. For example, a diameter of a respective mesa structure of the first subset of emitters 200 may be different (e.g., larger or smaller) than a diameter of a respective mesa structure of the second subset of emitters 200. In some implementations, the different configurations of areas of energy intensity may comprise the first diameter and the second diameter.

In some implementations, process 300 may include forming the first subset of emitters 200 with a first shape of oxidation trenches, and forming the second subset of emitters 200 with a second shape of oxidation trenches. For example, a first respective shape of oxidation trenches associated with the first subset of emitters 200 may be different than a second respective shape of oxidation trenches associated with the second subset of emitters 200. In some implementations, the first shape and the second shape may cause the first configuration of areas of energy intensity and the second configuration of areas of energy intensity to overlap with each other. For example, the different shapes may cause the first configuration and the second configuration to overlap based on a respective beam from the first subset of emitters 200 and the second subset of emitters 200 to have different configurations of areas of energy intensity.

In some implementations, process 300 may include forming the first subset of emitters 200 with a first pattern of areas of energy intensity as the first configuration of areas of energy intensity, and forming the second subset of emitters 200 with a second pattern of areas of energy intensity as the second configuration of areas of energy intensity. For example, the first subset of emitters 200 and the second subset of emitters 200 may have different patterns of areas of energy intensity (e.g., different patterns of areas of high energy intensity (or hot spots of energy intensity) and areas of low energy intensity (or dark spots of energy intensity)).

In some implementations, process 300 may include forming the first subset of emitters 200 using a first mask with a first set of trench features associated with forming the first configuration of areas of energy intensity, and forming the second subset of emitters 200 using a second mask with a second set of trench features associated with forming the second configuration of areas of energy intensity. For example, process 300 may include forming the first subset of emitters 200 and the second subset of emitters 200 using different masks with different trench features (e.g., to cause different orientations of emitters 200, differently sized mesa structures of emitters 200, differently sized oxidation trenches, differently shaped emitters 200, emitters 200 with different modes, and/or the like). In some implementations, a single mask may be used to form the first subset of emitters 200 and the second subset of emitters 200. For example, different portions of the single mask may have different configurations of trench features to vary emitters 200 across an emitter array in a manner that is the same as or similar to that described elsewhere herein.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL) array, comprising:
    a first subset of VCSELs of a plurality of VCSELs; and
    a second subset of VCSELs of the plurality of VCSELs,
        wherein one or more first beams to be emitted by the first subset of VCSELs, when the VCSEL array is powered, and one or more second beams to be emitted by the second subset of VCSELs, when the VCSEL array is powered, have different patterns of areas of energy intensity,
        wherein the different patterns of areas of energy intensity include respective areas of high energy intensity and respective areas of low energy intensity,
        wherein a beam to be emitted by the VCSEL array has an energy intensity profile that is more uniform relative to a first energy intensity profile of the one or more first beams to be emitted by the first subset of VCSELs alone and a second energy intensity profile of the one or more second beams to be emitted by the second subset of VCSELs alone, and
        wherein the energy intensity profile of the beam to be emitted by the VCSEL array has an intensity at a center portion of the beam that is lower than a peak intensity of the energy intensity profile of the beam to be emitted by the VCSEL array.

2. The VCSEL array of claim 1, wherein the different patterns are based on VCSELs in the first subset of VCSELs having a different orientation than VCSELs in the second subset of VCSELs.

3. The VCSEL array of claim 1, wherein the different patterns are based on VCSELs in the first subset of VCSELs having a different mode than VCSELs in the second subset of VCSELs.

4. The VCSEL array of claim 1, wherein the different patterns are based on different patterns of the respective areas of high energy intensity and the respective areas of low energy intensity for the first subset of VCSELs and the second subset of VCSELs.

5. The VCSEL array of claim 1, wherein the different patterns are based on VCSELs in the first subset of VCSELs having a different shape than VCSELs in the second subset of VCSELs.

6. The VCSEL array of claim 1, wherein the different patterns of areas of energy intensity cause the respective areas of high energy intensity and the respective areas of low energy intensity to overlap such that the beam to be emitted by the VCSEL array, when the VCSEL array is powered, has a lower energy intensity ratio than a first energy intensity ratio of the one or more first beams emitted by the first subset of VCSELs and a second energy intensity ratio of the one or more second beams emitted by the second subset of VCSELs,
    wherein the beam to be emitted by the VCSEL array is an aggregated beam of the one or more first beams and the one or more second beams.

7. The VCSEL array of claim 1, wherein a first energy intensity profile of an aggregation of the one or more first beams and the one or more second beams is different than a second energy intensity profile of the one or more first beams emitted from the first subset of VCSELs and a third energy intensity profile of the one or more second beams emitted from the second subset of VCSELs,
    wherein the first energy intensity profile of the aggregation is an aggregated beam profile of the second energy intensity profile of the one or more first beams and the third energy intensity profile of the one or more second beams.

8. A method of forming a vertical cavity surface emitting laser (VCSEL) array, comprising:
    forming a first subset of VCSELs of a plurality of VCSELs on or within a substrate,
        wherein forming the first subset of VCSELs includes forming the first subset of VCSELs such that the first subset of VCSELs is configured to output a first pattern of areas of energy intensity; and forming, in association with forming the first subset of VCSELs, a second subset of VCSELs of the plurality of VCSELs on or within the substrate,
  wherein forming the second subset of VCSELs includes forming the second subset of VCSELs such that the second subset of VCSELs is configured to output a second pattern of areas of energy intensity that is different than the first pattern of areas of energy intensity,
  wherein the first subset of VCSELs and the second subset of VCSELs are formed such that a beam to be emitted by the VCSEL array has an energy intensity profile that is more uniform relative to a first energy intensity profile of a one or more first beams to be emitted by the first subset of VCSELs alone and a second energy intensity profile of a one or more second beams to be emitted by the second subset of VCSELs alone, and
  wherein the energy intensity profile of the beam to be emitted by the VCSEL array has an intensity at a center portion of the beam that is lower than a peak intensity of the energy intensity profile of the beam to be emitted by the VCSEL array.

9. The method of claim 8, wherein forming the first subset of VCSELs and the second subset of VCSELs comprises:
  forming the first subset of VCSELs and the second subset of VCSELs with different orientations of oxidation trenches for the first subset of VCSELs and the second subset of VCSELs,
    wherein different patterns of the first pattern and the second pattern comprise the different orientations of oxidation trenches.

10. The method of claim 8, wherein forming the second subset of VCSELs comprises:
  forming the second subset of VCSELs such that respective areas of high energy intensity and respective areas of low energy intensity of the first pattern and the second pattern overlap with each other during emission to generate an energy intensity ratio for the beam to be emitted from the VCSEL array that is less than a first energy intensity ratio of the one or more first beams to be emitted by the first subset of VCSELs and a second energy intensity ratio of the one or more second beams to be emitted by the second subset of VCSELs.

11. The method of claim 8, wherein forming the first subset of VCSELs comprises:
  forming a first VCSEL, of the first subset of VCSELs, with a first diameter of a mesa structure of the first VCSEL; and
  wherein forming the second subset of VCSELs comprises:
    forming a second VCSEL, of the second subset of VCSELs, with a second diameter of a mesa structure of the second VCSEL,
      wherein the first diameter and the second diameter are different,
      wherein the second pattern of areas of energy intensity is different than the first pattern of areas of energy intensity based on the first diameter being different from the second diameter.

12. The method of claim 8, wherein forming the first subset of VCSELs comprises:
  forming the first subset of VCSELs with a first shape of oxidation trenches; and
  wherein forming the second subset of VCSELs comprises:
    forming the second subset of VCSELs with a second shape of oxidation trenches,
      wherein the first shape and the second shape are different,
      wherein the first shape and the second shape being different are to cause the first pattern of areas of energy intensity and the second pattern of areas of energy intensity to overlap with each other.

13. The method of claim 8, wherein forming the first subset of VCSELs comprises:
  forming the first subset of VCSELs with a first shape of areas of energy intensity as the first pattern of areas of energy intensity; and
  wherein forming the second subset of VCSELs comprises:
    forming the second subset of VCSELs with a second shape of areas of energy intensity as the second pattern of areas of energy intensity,
      wherein the first shape of areas of energy intensity and the second shape of areas of energy intensity are different.

14. The method of claim 8, wherein forming the first subset of VCSELs comprises:
  forming the first subset of VCSELs using a mask,
    wherein the mask includes a first set of trench features associated with forming the first pattern of areas of energy intensity; and
  wherein forming the second subset of VCSELs comprises:
    forming the second subset of VCSELs using the mask,
      wherein the mask includes a second set of trench features associated with forming the second pattern of areas of energy intensity,
        wherein the first set of trench features of the mask is different than the second set of trench features of the mask.

15. An emitter array, comprising:
  a first subset of emitters of a plurality of emitters; and
  a second subset of emitters of the plurality of emitters,
    wherein one or more first beams to be emitted by the first subset of emitters, when the emitter array is powered, and one or more second beams to be emitted by the second subset of emitters, when the emitter array is powered, have different patterns of areas of energy intensity,
      wherein the different patterns of areas of energy intensity include respective areas of high energy intensity and respective areas of low energy intensity that overlap with each other at least partially in a far field of the emitter array,
      wherein a beam to be emitted by the emitter array has an energy intensity profile that is more uniform relative to a first energy intensity profile of the one or more first beams to be emitted by the first subset of emitters alone and a second energy intensity profile of the one or more second beams to be emitted by the second subset of emitters alone, and
      wherein the energy intensity profile of the beam to be emitted by the emitter array has an intensity at a center portion of the beam that is lower than a peak intensity of the energy intensity profile of the beam to be emitted by the emitter array.

16. The emitter array of claim 15, wherein the overlap is to cause the beam to be emitted by the emitter array, when the emitter array is powered, to have a lower energy intensity ratio than a first energy intensity ratio of the one or more first beams emitted by the first subset of emitters and a second energy intensity ratio of the one or more second beams emitted by the second subset of emitters.

17. The emitter array of claim 15, wherein the first subset of emitters has a first orientation and the second subset of emitters has a second orientation that is different than the first orientation, and wherein the first orientation and the second orientation are associated with causing the overlap.

18. The emitter array of claim 15, wherein the first subset of emitters has a first respective shape and the second subset of emitters has a second respective shape that is different than the first respective shape, and wherein the first respective shape and the second respective shape are associated with causing the overlap.

19. The emitter array of claim 15, wherein the one or more first beams has a first pattern of energy intensity hot spots and dark spots and the one or more second beams has a second pattern of energy intensity hot spots and dark spots that is different than the first pattern of energy intensity hot spots and dark spots, and wherein the first pattern of energy intensity hot spots and dark spots and the second pattern of energy intensity hot spots and dark spots are associated with causing the overlap.

20. The emitter array of claim 15, wherein the first subset of emitters has a first respective trench-to-trench diameter and the second subset of emitters has a second respective trench-to-trench diameter that is different than the first respective trench-to-trench diameter, wherein the first respective trench-to-trench diameter and the second respective trench-to-trench diameter are associated with causing the overlap.

21. The VCSEL array of claim 1, wherein a difference between the intensity at the center portion of the beam and the peak intensity is less than 10%.

* * * * *